United States Patent [19]

Taylor

[11] 3,989,886
[45] Nov. 2, 1976

[54] WIRING DUCT COVER MOUNTING ASSEMBLY
[75] Inventor: Philip W. Taylor, Howell, Mich.
[73] Assignee: Taylor Industries, Inc., Howell, Mich.
[22] Filed: June 5, 1975
[21] Appl. No.: 583,992

[52] U.S. Cl. .............................. 174/135; 24/73 P; 174/72 A; 174/138 D; 317/122
[51] Int. Cl.² ...................... H05K 7/02; H02G 3/02
[58] Field of Search ................. 174/72 A, 101, 135, 174/138 D, 158 R, 164; 317/119, 122; 24/73 R, 73 P, 73 PF, 73 PM; 248/73, 223

[56] References Cited
UNITED STATES PATENTS
3,225,264  12/1965  Weiss ........................... 317/122 UX
3,393,350  7/1968  Goudy et al. ................. 174/72 A X
3,705,949  12/1972  Weiss ........................... 174/72 A X

*Primary Examiner*—Laramie E. Askin
*Attorney, Agent, or Firm*—Hauke & Patalidis

[57] ABSTRACT

A support pin assembly for mounting a wiring passageway cover on a wiring passageway base. The assembly, made of plastic material, consists of a pin and a support clip having a mounting aperture for fastening to the wiring passageway base. The clip has a pair of pin-mounting apertures spaced on opposite sides of the mounting aperture. There is a latching lip at the edge of each pin-mounting aperture. The base of the pin is generally U-shaped with extending legs each terminating in a hook configuration for locking engagement with the latching lip of one of the pin-mounting apertures.

21 Claims, 5 Drawing Figures

WIRING DUCT COVER MOUNTING ASSEMBLY

BACKGROUND OF THE INVENTION

The present invention relates to wiring passageways for use on electrical control panels. The basic form of a type of wiring passageways utilizes a duct with openings in the sides which serve as multiple choice outlets for wires running through the duct. Electrical components and devices mounted on the panel board surface are interconnected by circuit wiring which enters the ducts by the most direct route and leaves upon reaching the desired point of termination. This type of duct work is illustrated in U.S. Pat. Nos. 2,921,607, 3,088,055, 3,705,949 and 3,809,799.

A system of ducting which is both simple and inexpensive utilizes the electrical control devices themselves, such as relays, positioned in rows to form the equivalent of duct walls. Metallic pins extending perpendicularly from the control panel wall are positioned at spaced intervals between adjacent rows of control devices. After wires are connected to the control devices, cover members are mounted upon the pins to cover the wiring between adjacent rows. Conventionally, the cover member is an elongated extrusion of plastic material with a pair of spaced longitudinal ribs perpendicularly extending near the center thereof to serve as a means for mounting the cover on the mounting pins. The extended ends of the ribs are flanged so as to mate with a circumferential groove near the upper end of the pins, thereby enabling locking engagement to be made between the cover and the mounting pins. Conventionally, the metal mounting pins have a screw thread at their base so that the pins can be fixedly mounted in threaded apertures in the panel board.

It is an object of the present invention to provide an improved pin assembly for mounting a cover on a panel board.

SUMMARY OF THE INVENTION

The present invention is directed to a pin and support clip assembly for mounting the cover of a wiring passageway. The assembly consists of two members, preferably formed of a plastic material possessing resiliency, typically they are made of injection molded plastics. One of the members is a generally flat clip having a central aperture for mounting on a panel board. The clip has a pair of spaced apertures, each of which includes a latching lip at the exposed surfaces of the apertures which are nearest to each other. The other member of the assembly is a pin which extends outward from the exposed face of the clip. The pin has one end which is bifurcated, the tips of the bifurcations having a hook configuration and being slightly spreadable. The pin is attached to the clip by pressing the bifurcated ends into the pin mounting apertures. A little pressure spreads the bifurcated ends sufficiently for the hooks to lock over the latching lips and retain the pin in fixed position on the clip. The extending end of the pin has a peripheral groove which serves to lock into position the flanged portion of a cover member.

DESCRIPTION OF THE PREFERRED EMBODIMENT

Figure 1:
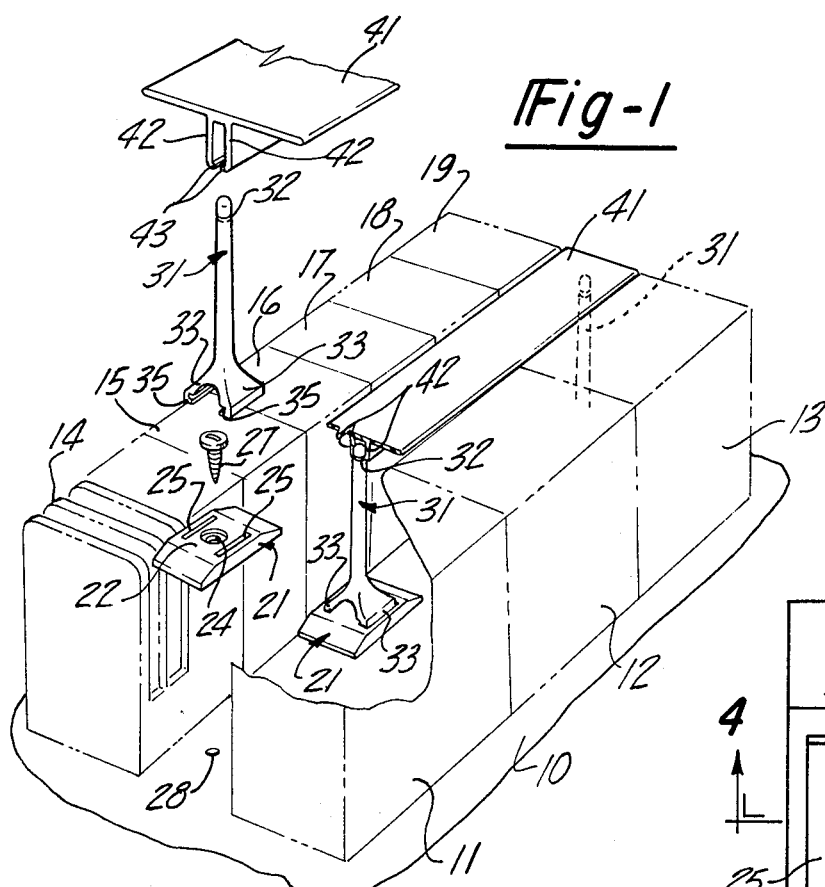
FIG. 1 is a broken and in part exploded perspective view of a pin and clip assembly of this invention with a cover shown in both mounted and unmounted position.

In FIG. 1, a panel board 10 is shown provided with a first row of electrical devices 11–13 mounted thereon. These devices may be relays or other control elements and are shown in box form for convenience. Spaced a short distance from the first row of devices 11–13 is a second parallel row of devices 14–19. These devices are likewise shown in box form for simplicity of illustration. The devices 11–13 form one wall of a wiring passageway and the devices 14–19 form the other wall of the passageway. The surface of the panel board 10 between the two rows of devices serves as the base for the wiring passageway. If desired, a metal channel member (not shown) may form the base of the wiring passageway.

The passageways defined by the walls of the two rows of wiring devices which face each other and the surface of the panel board 10 are normally occupied by a network of electrical circuit wires after installation. However, such wiring has not been illustrated in FIG. 1 as it does not constitute any part of the present invention.

Figure 3:
FIG. 3 is a top plan view of a clip made in accordance with this invention.
Figure 3:
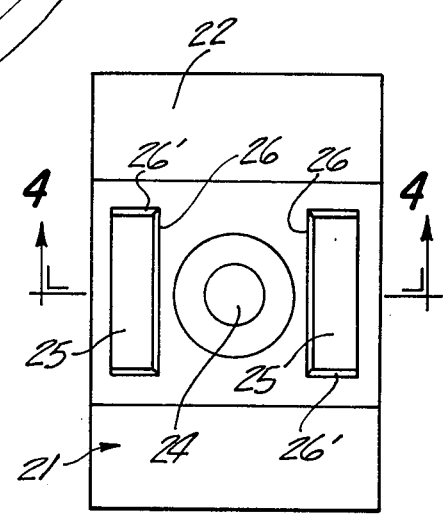
Figure 4:
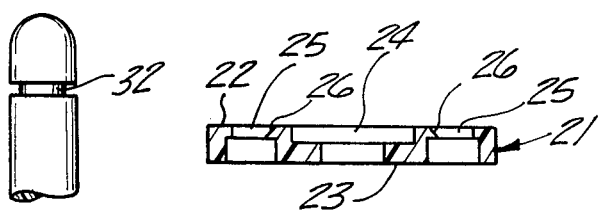
FIG. 4 is a sectional view of the clip taken along the line 4—4 of FIG. 3.

A row of clips 21 each having an upper surface 22, a lower surface 23, and a central aperture 24 is positioned midway between the first and second rows of devices by means of adhesive, screws 27 or similar fastening means extending through the aperture 24 and engaging a mounting hole 28 in the panel board 10. As best shown in FIGS. 3 and 4, the clip 21 is provided with a pair of spaced apertures 25 which may be rectangular in configuration. The edge of each aperture 25 proximate the mounting aperture 24 is provided with an inclined projecting latching lip 26. While the apertures 25 are shown as extending entirely through the material of the clip 21, it is not necessary that they do so provided there is enough clearance below the interior surface of the latching lips 26.

Figure 2:
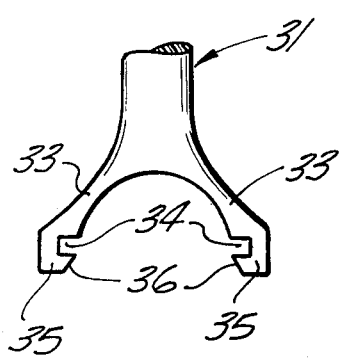
FIG. 2 is a broken view of a pin made in accordance with this invention.

A pin 31 extends perpendicularly from the upper surface 22 of each clip 21. The stem of the pin 31 is preferably of circular cross-section and has a circumferential groove 32 near the extended end thereof. The opposite or base end of the pin 31 terminates in a generally U-shaped bifurcated configuration with a pair of extending legs 33. Each of the legs 33 has an inwardly disposed radial slot 34 and terminates in a hook 35, as best illustrated in FIG. 2, provided with a downwardly and inwardly directed inclined surface 36.

Figure 5:
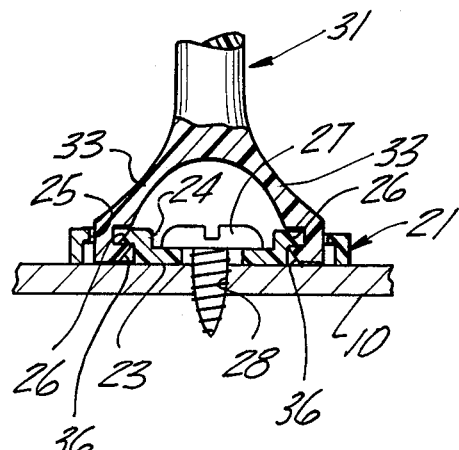
FIG. 5 is a partial sectional view showing the pin and clip assembly fastened to a panel board.

During assembly, the clip 21 is securely fastened to a surface comprising the base of a wiring passageway by means of a screw 27 passing through the aperture 24 or by other means. The pin is mounted on the clip 21 by pressing the extending legs 33 of the pin through the apertures 25 of the clip. A slight pressure spreads the legs 33 apart as a result of the inclined surface 36 of the hooks 35 engaging the inclined surface of the clip aperture lips 26 sufficiently to enable the hooks 35 to pass over the latching lips 26 of the clip apertures 25. The resilience of the material forming the pin 31 then restores the legs 33 to their initial position with the result that the pin 31 is locked in place with the lower surface of the slots 34 engaged against the latching lips 26, as illustrated at FIG. 5. The short sides of the clip apertures 25 are also preferably provided with inclined edges 26', FIG. 3, to guide and center the hooks of the pins 31 within the clip apertures 25.

A plurality of clip 21 – pin 31 assemblies are installed in spaced alignment along a wiring passageway either before or after the electrical devices 11–19 are in place. After the wiring is completed, a cover member 41 is attached to the end of the pins 31. The cover member 41 has a pair of parallel, closely adjacent longitudinal ribs 42 which define a center groove used to mount the cover on the pins 31. The longitudinal ribs 42 are provided with inwardly extending flanges or lips 43 at their free end. The wiring passageway is enclosed by placing the cover member 41 with the tapered or radiused heads of the pins 31 engaged between the ribs 42 and pressing down to force the ribs apart until the flanges 43 seat in the pin grooves 32.

The cover member 41 is preferably composed of an extruded plastic material such as polyethylene, acrylonitrile-butadienestyrene or polyvinyl chloride. Polyvinyl chloride is a particularly desirable material because of its flame-resistant properties. It is important that the extruded material has sufficient resilience for the longitudinal ribs 42 to be forced apart slightly and then restored as the flanges 43 lock into the circumferential grooves 32.

The clip 21 and pin 31 are desirably formed of a plastic material and generally are formed of the same plastic material. Such materials as nylon, polyacrylates, polyformaldehyde, polycarbonate and polyester are suitable materials. Of these, nylon is preferred because its resilient characterics result in an assembly in which the pin is firmly locked in the clip. Generally, the clip and pin are formed by an injection molding process.

Although the locking slots 34 have been shown and described as being inwardly directed for locking engagement with the latching lips 26 of the pin mounting apertures 25, alternatively, the pin legs may be provided each with an outwardly directed locking slot for engagement with a clip having latching lips formed in the outermost edges of the pin mounting apertures. Also, the interlocking means may be reversed, namely, the pin legs may be provided each with a projecting tang for interlocking with an appropriate grooved recess on the edge of the clip pin-mounting aperture.

While the present invention has been described with reference to certain particular embodiments, it is obvious that there may be variations which properly fall within the scope of the invention. Therefore, the invention should be limited in scope only as may be necessitated by the scope of the appended claims.

What is claimed is:

1. An assembly for positioning a cover on a base comprising a clip having upper and lower surfaces, said clip being fastenable to said base with its lower surface in engagement with said base, said clip having a pair of spaced pin-mounting apertures with a latching lip on an edge of each of said apertures, and a pin with an end mounted on said clip through said pin-mounting apertures, said end of said pin being of generally U-shaped with bifurcated extending legs each terminating in a hook configuration for locking engagement with said latching lip.

2. An assembly as claimed in claim 1 in which the pin extends perpendicularly to the upper surface of said clip.

3. An assembly as claimed in claim 1 in which the pin-mounting apertures have a rectangular configuration.

4. An assembly as claimed in claim 3 in which the latching lips are on the innermost side of the pin-mounting apertures.

5. An assembly as claimed in claim 1 wherein each of said latching lips is in the form of an edge of said aperture having an inclined surface disposed towards the upper surface of said clip.

6. An assembly as claimed in claim 5 wherein said hook configuration comprises a radially directed slot proximate the end of each of said legs and an inclined surface at the end of said legs for resiliently flexing said legs when said inclined surface engages said aperture lip inclined surface during assembly of said pin with said clip.

7. An assembly as claimed in claim 6 further comprising an inclined edge at each side of said apertures at both ends of said latching lips.

8. An assembly as claimed in claim 1 in which the clip and pin are composed of plastic material.

9. An assembly as claimed in claim 8 in which the plastic material is nylon.

10. An assembly as claimed in claim 1 in which the pin has a stem of circular cross-sectional configuration.

11. An assembly as claimed in claim 10 in which the pin has a circumferential groove near the end there of opposite said legs for mounting a cover.

12. An assembly holding a cover in spacial relationship over a base, said assembly comprising at least a pair of clips having upper and lower surfaces, each of said clips being fastenable to said base with its lower surface in engagement with said base, each of said clips having a pair of spaced pin-mounting apertures with a latching lip on an edge of each of said apertures, a pin associated with each clip, said pin having an end mounted on said clip through said pin-mounting apertures, said end of said pin being of generally U-shape with bifurcated extending legs each terminating in a hook configuration for locking engagement with said latching lip, and said cover being in the form of an elongated extruded plastic cover having longitudinal ribs defining a groove which mounts said cover on the extended end of each of the pins.

13. An assembly as claimed in claim 12 in which the pin has a circumferential groove near the end thereof opposite said legs and in which the longitudinal ribs of the cover are flanged at their interior protruding surfaces, the flanged portions of said ribs engaging the circumferential groove of said pin.

14. An assembly as claimed in claim 12 in which the extruded plastic is polyvinyl chloride.

15. An assembly for supporting a cover over a base comprising a pin having means on an end thereof for attaching said cover thereto and a pair of bifurcated legs on the other end, said legs being resiliently laterally flexible, a clip having a generally flat lower surface and a central mounting aperture for mounting on said base with said lower surface in engagement with said base, and a pair of spaced apertures in said clip accepting in engagement therein the ends of said bifurcated legs, said pin having interlocking means at the end of said bifurcated legs engageable with the edge of said apertures for mutual locking engagement when said pin bifurcated legs are engaged into said apertures.

16. An assembly as claimed in claim 15 in which the pin extends perpendicularly with respect to the upper surface of the clip.

17. An assembly as claimed in claim 15 in which the pin and clip are composed of injection molded plastic material.

18. An assembly as claimed in claim 17 in which the plastic material is nylon.

19. An assembly as claimed in claim 15 in which there is a latching lip at the edge of each of said spaced apertures and in which said interlocking means comprises a radially directed slot proximate the end of each of said bifurcated legs for engagement by said latching lips.

20. An assembly as claimed in claim 19 further comprising an inclined surface proximate each slot for deflecting said legs during insertion thereof into each spaced aperture.

21. An assembly as claimed in claim 20 further comprising an inclined surface on each latching lip corresponding to the inclined surface proximate each slot.

* * * * *